United States Patent
Choi et al.

(10) Patent No.: US 9,734,058 B2
(45) Date of Patent: *Aug. 15, 2017

(54) OPTIMIZING CONFIGURATION MEMORY BY SEQUENTIALLY MAPPING THE GENERATED CONFIGURATION DATA BY DETERMINING REGULAR ENCODING IS POSSIBLE AND FUNCTIONAL UNITS ARE THE SAME IN ADJACENT CYCLES

(71) Applicant: Samsung Electronics Co., Ltd., Suwon-si (KR)

(72) Inventors: Yoonseo Choi, Seoul (KR); Tai-song Jin, Seoul (KR); Donghoon Yoo, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 120 days.

This patent is subject to a terminal disclaimer.

(21) Appl. No.: 14/461,718

(22) Filed: Aug. 18, 2014

(65) Prior Publication Data

US 2015/0127934 A1 May 7, 2015

Related U.S. Application Data

(63) Continuation of application No. 14/296,876, filed on Jun. 5, 2014.

(30) Foreign Application Priority Data

Nov. 1, 2013 (KR) .................. 10-2013-0132534
Feb. 4, 2014 (KR) .................. 10-2014-0012788
(Continued)

(51) Int. Cl.
*G06F 1/24* (2006.01)
*G06F 9/00* (2006.01)
(Continued)

(52) U.S. Cl.
CPC ............ *G06F 12/0653* (2013.01); *G06F 9/30* (2013.01); *G06F 9/44505* (2013.01); *H03M 7/30* (2013.01)

(58) Field of Classification Search
CPC .... G06F 12/0653; G06F 9/30; G06F 9/44505; H03M 7/30
See application file for complete search history.

(56) References Cited

U.S. PATENT DOCUMENTS 7,409,530 B2    8/2008   Kim et al.
8,069,335 B2   11/2011   Kievits et al.
(Continued)

FOREIGN PATENT DOCUMENTS

JP    2003-50704 A      2/2003
KR   10-2009-0045744 A  5/2009
(Continued)

OTHER PUBLICATIONS

Park, Hyunchul, et al. "Polymorphic Pipeline Array: A Flexible Multicore Accelerator with Virtualized Execution for Mobile Multimedia Applications." Proceedings of the 42nd Annual IEEE/ACM International Symposium on Microarchitecture. ACM, 2009. (32 pages).

*Primary Examiner* — Mohammed Rehman
*Assistant Examiner* — Gayathri Sampath
(74) *Attorney, Agent, or Firm* — Harness, Dickey & Pierce, P.L.C.

(57) ABSTRACT

A method and apparatus for optimizing a configuration memory of a reconfigurable processor is provided. The method of optimizing the configuration memory of the reconfigurable processor includes analyzing parallelism of a loop of a program code based on an architecture of the reconfigurable processor and information regarding the configuration memory, scheduling groups of function units (FUs) to be activated in each cycle of the loop based on the
(Continued)

analyzed parallelism, generating configuration data of each cycle, and determining a memory mapping to store the generated configuration data in the configuration memory.

12 Claims, 12 Drawing Sheets

(30) Foreign Application Priority Data

Feb. 4, 2014 (KR) .......................... 10-2014-0012789
Feb. 4, 2014 (KR) .......................... 10-2014-0012790

(51) Int. Cl.
*G06F 12/06* (2006.01)
*G06F 9/445* (2006.01)
*G06F 9/30* (2006.01)
*H03M 7/30* (2006.01)

(56) References Cited

U.S. PATENT DOCUMENTS

| | | |
|---|---|---|
| 2004/0181648 A1 | 9/2004 | Jacobs et al. |
| 2006/0155957 A1 | 7/2006 | Lee et al. |
| 2007/0266229 A1 | 11/2007 | Plondke et al. |
| 2008/0120493 A1* | 5/2008 | Yoo .......................... G06F 8/443 |
| | | 712/225 |
| 2009/0070552 A1* | 3/2009 | Kanstein ............. G06F 15/7867 |
| | | 712/29 |

FOREIGN PATENT DOCUMENTS

| | | |
|---|---|---|
| KR | 10-0948512 B1 | 3/2010 |
| KR | 10-2010-0089350 A | 8/2010 |
| KR | 10-1101992 B1 | 1/2012 |
| KR | 10-2013-0066403 A | 6/2013 |

* cited by examiner

OPTIMIZING CONFIGURATION MEMORY BY SEQUENTIALLY MAPPING THE GENERATED CONFIGURATION DATA BY DETERMINING REGULAR ENCODING IS POSSIBLE AND FUNCTIONAL UNITS ARE THE SAME IN ADJACENT CYCLES

RELATED APPLICATIONS

This application is a continuation of U.S. patent application Ser. No. 14/296,876, filed on Jun. 5, 2014, which claims the benefits under 35 USC 119(a) of Korean Patent Application No. 10-2013-0132534, filed on Nov. 1, 2013, Korean Patent Application No. 10-2014-0012788, filed on Feb. 4, 2014, Korean Patent Application No. 10-2014-0012789, filed on Feb. 4, 2014, and Korean Patent Application No. 10-2014-0012790, filed on Feb. 4, 2014, in the Korean Intellectual Property Office, the entire disclosure of all the above-referenced Korean Patent Applications are incorporated herein by reference for all purposes.

BACKGROUND

1. Field

The following description relates to a reconfigurable processor, and a method and apparatus for optimizing use of a configuration memory.

2. Description of Related Art

A reconfigurable architecture refers to an architecture that may change hardware configuration of a computing device so that the hardware configuration is better suited to perform the particular task. If a task is processed by fixed hardware of the computing device, and work contents of the task are slightly changed, it is difficult to efficiently process the changed work contents due to fixed functions of the fixed hardware. If the particular task is processed by software, operations of the software may be changed to be appropriate for the changed work contents. However, a processing speed may be slower for software processing than when hardware is used.

The reconfigurable architecture may optimize the utility of the hardware and the software. Such a reconfigurable architecture is significant in the field of digital signal processing (DSP) where a task is repeatedly performed.

The reconfigurable architecture may be of several types, and coarse-grained array (CGA) is one such representative example. A reconfigurable architecture that may use some of CGA as a very long instruction word (VLIW) machine has recently appeared. Such a reconfigurable architecture may have two execution modes such as a CGA mode and a VLIW mode. The reconfigurable architecture having the CGA mode and the VLIW mode may be realized to process a loop operation in the CGA mode and process a general operation in the VLIW mode.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, there is provided a method of optimizing use of a configuration memory of a reconfigurable processor, the method including analyzing parallelism of a loop of a program code based on an architecture of the reconfigurable processor and details of the configuration memory, scheduling groups of function units (FUs), which will be activated in each cycle of the loop, according to the analyzed parallelism to generate configuration data of each cycle, and sequentially mapping the generated configuration data in at least one row of the configuration memory with respect to the scheduled groups in adjacent cycles.

The same types of FUs may be scheduled to be activated in each cycle in order to generate the configuration data.

Some of all FUs comprised in the reconfigurable processor may be scheduled to be repeatedly activated in each cycle in order to generate the configuration data.

The generated configuration data may be mapped in the configuration memory by using regular encoding The configuration data respectively corresponding to the groups may be regularly mapped to each of fields of the configuration memory.

The parallelism may be analyzed based on information about the number of FUs comprised in the reconfigurable processor, interconnections between the FUs, and multiplexing between the FUs and the configuration memory.

The method may include determining whether regular encoding is possible with respect to the configuration data, based on the architecture and the details of the configuration memory, and if the regular encoding is possible, determining whether the groups are the same in the adjacent cycles, wherein if it is determined that the regular encoding is possible, and the groups are the same, the generated configuration data is mapped in the configuration memory in the adjacent cycles.

In another general aspect, there is provided an apparatus for optimizing use of a configuration memory of a reconfigurable processor, the apparatus including an analyzer which analyzes parallelism of a loop of a program code based on an architecture of the reconfigurable processor and details of the configuration memory, a scheduling unit which schedules groups of FUs, which will be activated in each cycle of the loop, according to the analyzed parallelism to generate configuration data of each cycle, and a determiner which sequentially maps the generated configuration data in at least one row of the configuration memory with respect to the scheduled groups in adjacent cycles.

The scheduling unit may schedule the same types of FUs to activate the same types of FUs in each cycle in order to generate the configuration data.

The scheduling unit may schedule some of all FUs comprised in the reconfigurable processor to repeatedly activate the some FUs in each cycle in order to generate the configuration data.

The determiner may map the generated configuration data in the configuration memory by using regular encoding.

The determiner may classify each of fields of the configuration memory to regularly map the configuration data respectively corresponding to the groups.

The analyzer may analyze the parallelism based on information about the number of FUs comprised in the reconfigurable processor, interconnections between the FUs, and multiplexing between the FUs and the configuration memory.

The determiner may determine whether regular encoding is possible with respect to the configuration data, based on the architecture and the details of the configuration memory, if the regular encoding is possible, may determine whether the groups are the same in the adjacent cycles, and if it is determined that the regular encoding is possible, and the groups are the same, may map the generated configuration data in the configuration memory in the adjacent cycles.

Figure 1:
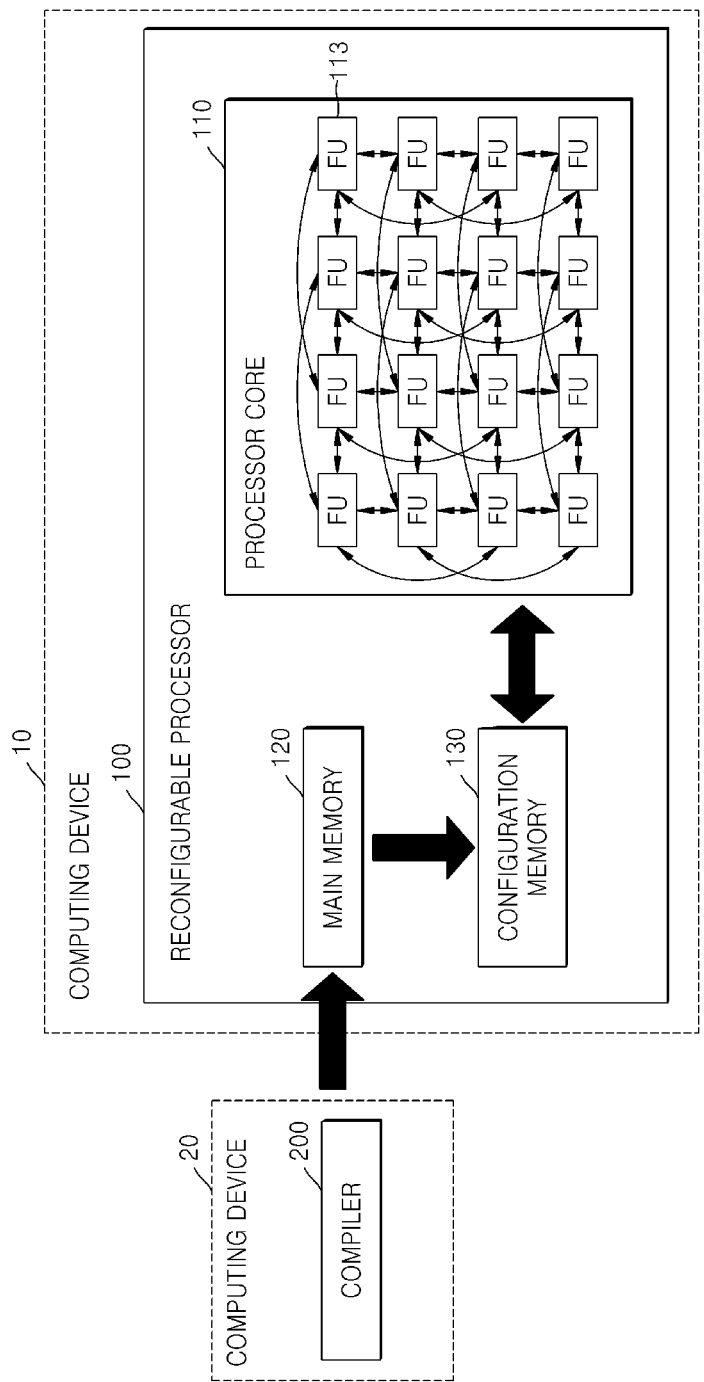
FIG. 1 is a diagram illustrating an example of computing devices.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

FIG. 1 is a diagram illustrating an example of computing devices 10 and 20. Referring to FIG. 1, the computing device 10 includes a reconfigurable processor 100. The reconfigurable processor 100 includes a processor core 110 having a plurality of function units (FUs) 113 and register files, a main memory 120, and a configuration memory 130. The computing device 20 includes a compiler 200.

While components related to the present example are illustrated in the computing devices 10 and 20 of FIG. 1, it is understood that those skilled in the art may include other general-purpose components.

Figure 2:
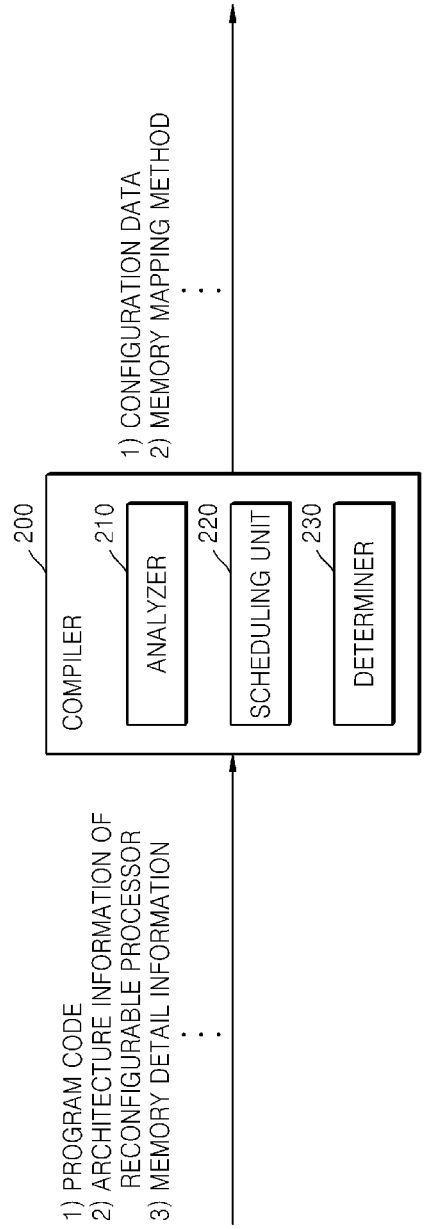
FIG. 2 is a diagram illustrating an example of a compiler.

FIG. 2 is a diagram illustrating an example of the compiler 200. Referring to FIG. 2, the compiler 200 includes an analyzer 210, a scheduling unit 220, and a determiner 230. While components related to the present example are illustrated in the compiler 200 of FIG. 2, it is understood that those skilled in the art may include other general-purpose components. Operations and functions of the computing devices 10 and compiler 200 will be described with reference to FIGS. 1 and 2.

The reconfigurable processor 100 refers to reconfigurable hardware that optimizes an operation of the processor core 110 to perform a task, instruction, or operation. Configurations of the FUs 113 that perform processing in the reconfigurable processor 100 may be determined by compilation that is generated by the compiler 200.

The processor core 110 includes an array of FUs 113. The FUs 113 of the processor core 110 may correspond to an arithmetic logic unit (ALU), a multiplier, or a load/store unit. A plurality of input/output paths may be included between the FUs 113. The processor core 110 may also include various types of register files including, but not limited to, a local register file.

The processor core 110 may support a coarse-grained reconfigurable array (CGRA) mode or a very long instruction word (VLIW) mode. For example, the processor core 110 may be hardware that supports only the CGRA mode, hardware that supports only the VLIW mode, or hardware that supports both of the CGRA and VLIW modes. The processor core 110 may support only one mode or it may support various types of modes.

The processor core 110 may process a loop operation in parallel by using several FUs 113 of the processor core 110 in the CGRA mode. If the processor core 110 operates in the CGRA mode, the processor core 110 may execute a loop level parallelism (LLP).

The processor core 110 may process a general serial operation and not the loop operation by using some FUs 113 of the processor core 110 in the VLIW mode. The processor core 110 may also perform a loop operation that is simple or less repeated, in the VLIW mode. In other words, if the processor core 110 operates in the VLIW mode, the processor core 110 may execute an instruction level parallelism (ILP).

The main memory 120 may be a hardware that stores configuration data transmitted from the compiler 200 and other types of data and may include random access memory, such as, for example, dynamic random access memory (DRAM).

The configuration data is data that includes operations codes (OP codes) of the FUs 113 of the processor core 110 scheduled (compiled) by the compiler 200 or connection information between the FUs 113. The configuration data includes information about processing schedules of overall operations that will be performed by the reconfigurable processor 100.

The configuration memory 130 is hardware that loads the configuration data from the main memory 120 and then stores the configuration data. The configuration memory 130 may be a hardware that stores configuration data transmitted from the compiler 200 and other types of data and may include random access memory, such as, for example, a static random access memory (SRAM) having a higher speed than a DRAM.

The compiler 200 converts a give program code into a low level language. For example, the compiler 200 converts a program code written in a high level language into a low level language, such as, for example, an assembly language or a machine language. The compiler 200 schedules operations of the FUs 113 by using commands of the assembly language or the machine language. The compiler 200 may use information stored in a memory (not shown) of the computing device 20 to compile the written program code.

The computing device 20 may pre-store information such as, for example, information about the given program code, information about an architecture of the reconfigurable processor 100 that will execute the program code, details of the FUs 113, interconnections between the FUs 113, details of the configuration memory 130, the number of register files, interconnections between the FUs 113 and the register files.

As described above, the compiler 200 may schedule to process an operation other than the loop operation in the VLIW mode of the reconfigurable processor 100. The compiler 200 may schedule to process the loop operation in the CGRA mode of the reconfigurable processor 100.

As shown in the example of FIG. 1, the computing devices 10 and 20 may correspond to independent computing devices. For example, the computing device 20 may compile the program code including a loop, and the compiled instructions may be executed by the reconfigurable processor 100 of the computing device 10. In another example, the computing devices 10 and 20 may be implemented as modules of a single computing device.

The computing device may be a devices, such as, for example, mobile device, cellular phone, smart phone, wearable smart device (such as, for example, ring, watch, pair of glasses, bracelet, ankle bracket, belt, necklace, earring, headband, helmet, device embedded in the cloths or the like), personal computer (PC), server computers, smartphones, tablet personal computer (tablet), phablet, personal digital assistants (PDAs), digital camera, portable game console, MP3 player, portable/personal multimedia player (PMP), handheld e-book, ultra mobile personal computer (UMPC), portable lab-top PC, global positioning system (GPS) systems, television (TV), high definition television (HDTV), optical disc player, DVD player, Blue-ray player, setup box, content players, communication systems, image processing systems, graphics processing systems, laptop computers, tablet PCs, or any other consumer electronics/information technology (CE/IT) device.

Figure 3:
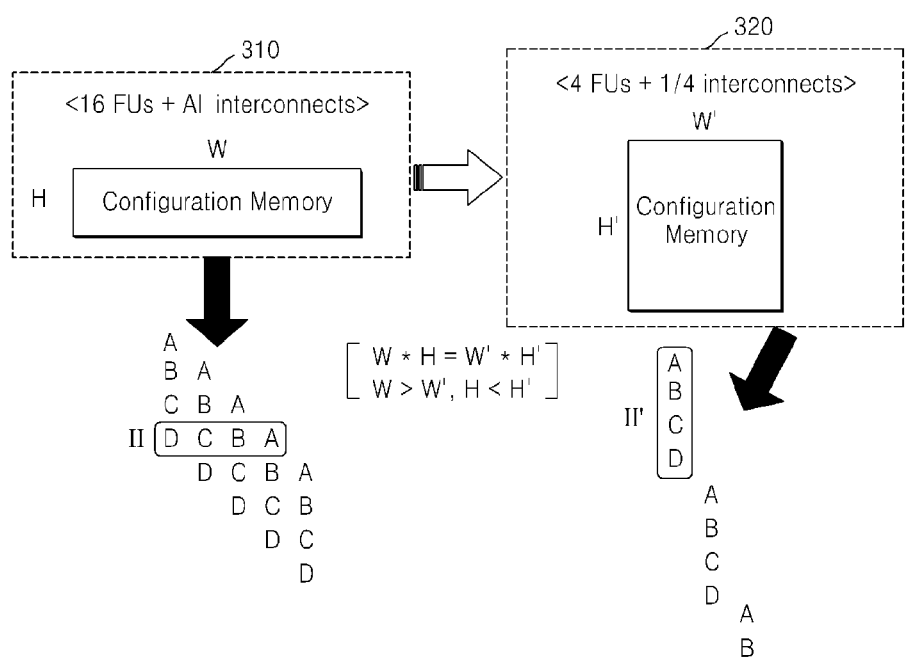
FIG. 3 is a diagram illustrating an example of a concept for optimizing configuration memory.

FIG. 3 is a diagram illustrating an example of a concept for optimizing use of the configuration memory 130. Referring to FIG. 3, a amount of configuration memory 130 used may be reduced when four FUs 113 are compiled to be activated (as shown in 320) than when all of 16 FUs 113 are compiled to be activated in the reconfigurable processor 100 (as shown in 310). For example, in the configuration shown in 310 and 320, sizes of data about interconnections between the FUs 113 may be different from each other.

When the four FUs 113 are compiled to be activated (320), only some of the 16 FUs 113 are activated. Therefore, a longer schedule may be processed than when all of the 16 FUs 113 are complied to be activated (320). An initiation interval of a loop operation may be increased when software pipelining, for example, the four FUs 114, are complied to be activated 320.

Therefore, according to a non-exhaustive example, in order to optimize the use of configuration memory 130, the compiler 200 may schedule to activate and process only some of the FUs 113 of the processor core 110.

Figure 4:
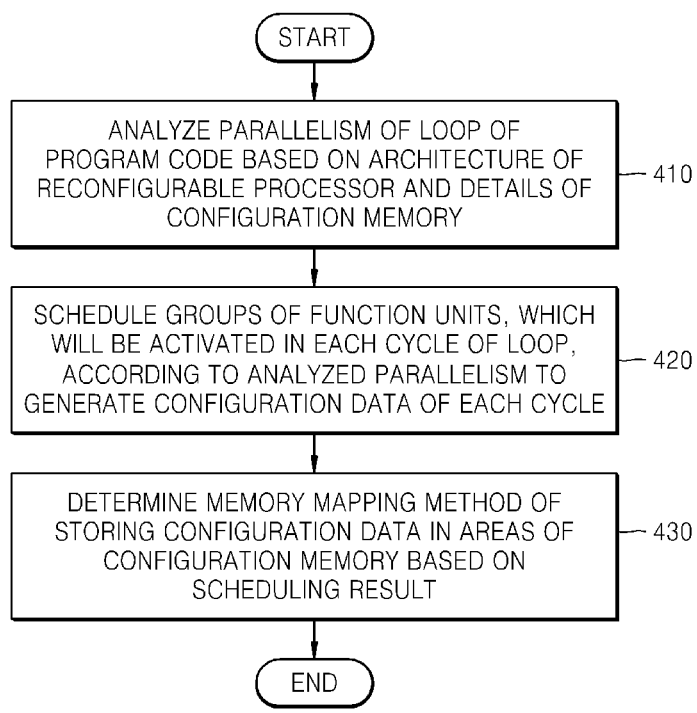
FIG. 4 is a diagram illustrating an example of a method of optimizing use of a configuration memory of a reconfigurable processor.

FIG. 4 is a diagram illustrating an example of a method of optimizing use of the configuration memory 130 of the reconfigurable processor 100. The operations in FIG. 4 may be performed in the sequence and manner as shown, although the order of some operations may be changed or some of the operations omitted without departing from the spirit and scope of the illustrative examples described. Many of the operations shown in FIG. 4 may be performed in parallel or concurrently.

The process of FIG. 4 is processed in time series in the computing devices 10 and 20 described with reference to FIGS. 1 and 2. The above descriptions of computing devices 10 and 20, is also applicable to FIG. 4 and to the method of optimizing the configuration memory 130 of the reconfigurable processor 100, and is incorporated herein by reference. Thus, the above description may not be repeated here.

In operation 410, the analyzer 210 of the compiler 200 analyzes parallelism of a loop of a give program code based on an architecture of the reconfigurable processor 100 and details of the configuration memory 130.

The architecture of the reconfigurable processor 100 includes, but is not limited to, information about the number of FUs 113 of the reconfigurable processor 100, interconnections between the FUs 113, multiplexing between the FUs 113 and the configuration memory 130. The analyzer 210 may analyze parallelism such as instruction level parallelism (ILP) or data level parallelism (DLP) of the loop of the given program code based on the architecture of the reconfigurable processor 100 and the details of the configuration memory 130 to determine the number of FUs 113 demanded in each cycle of the loop.

In operation 420, the scheduling unit 220 of the compiler 200 schedules groups of the FUs 113 that will be activated in each cycle of the loop, according to the analyzed parallelism to generate configuration data of each cycle.

The configuration data is data about OP codes of the FUs 113 and interconnections between the FUs 113. The configuration data generated by the scheduling unit 220 will be described in more detail with reference to FIG. 5.

In operation 430, the determiner 230 of the compiler 200 determines a memory mapping method for storing the generated configuration data in areas of the configuration memory 130 based on the scheduling result.

The memory mapping method determined by the determiner 230 may be a method for storing the configuration data, which will be processed in at least one or more cycles, in at least one row. For example, the determiner 230 may determine the memory mapping method to store the configuration data, which will be processed in one cycle, in all rows of the configuration memory 130. In another example, the determiner 230 may determine the memory mapping method to store configuration data, which will be processed in at least two cycles, in all rows of the configuration memory 130. The determiner 230 may also determine the memory mapping method to store configuration data, which will be processed in one cycle, in some rows of the configuration memory 130 and store configuration data, which will be processed in two or more cycles, in the other rows of the configuration memory 130. In other words, the memory mapping method determined by the determiner 230 is not limited to any one case.

If some of the FUs of the reconfigurable processor 100 are activated in adjacent cycles of the loop, the determiner 230 may determine any one of memory mapping method. The determiner 230 may determine one of first through fourth memory mapping methods in each cycle to store configuration data of each cycle in the configuration memory 130.

Figure 5:
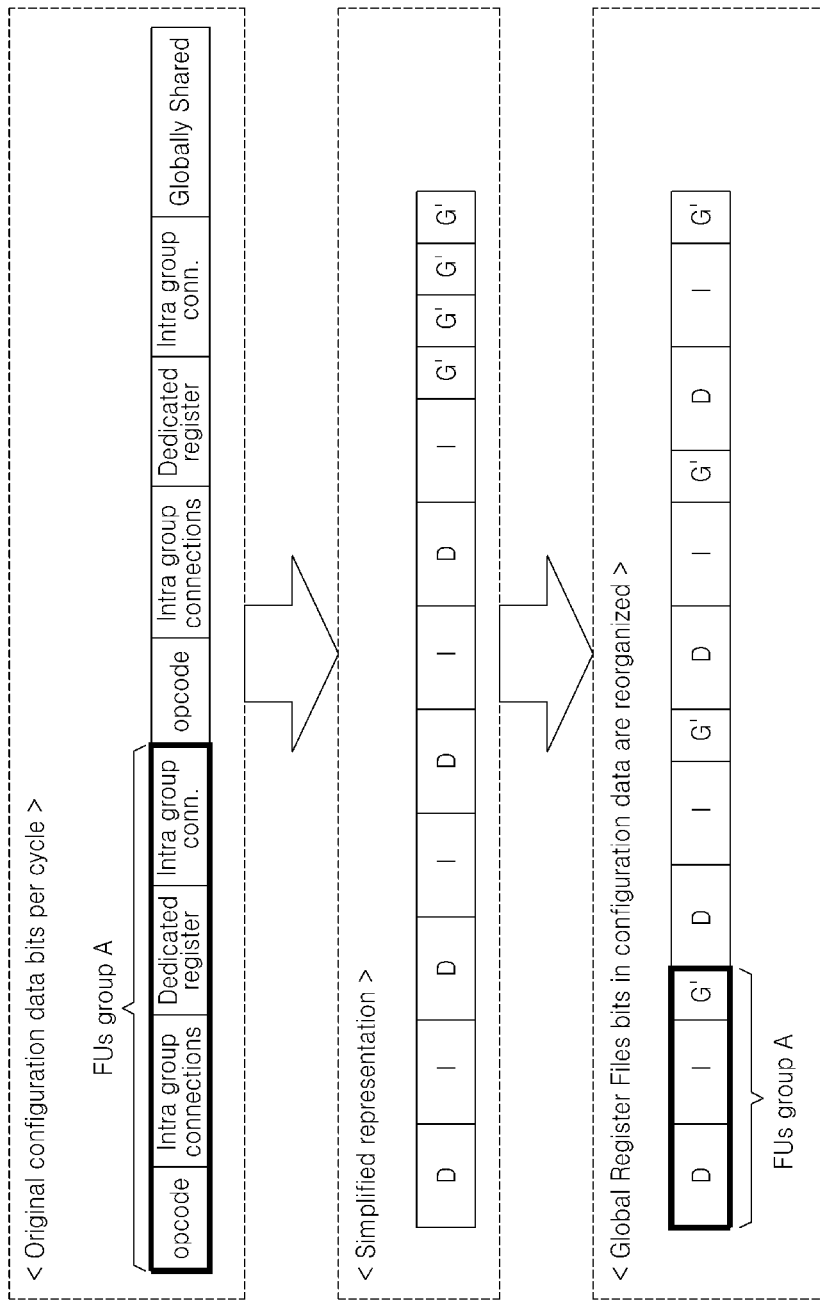
FIG. 5 is a diagram illustrating an example of configuration data that is generated by a scheduling unit of a compiler.

FIG. 5 is a diagram illustrating an example of configuration data generated by the scheduling unit 220 of the compiler 220. The scheduling unit 220 generates configuration data bits, which will be processed in each of groups of the FUs 113 scheduled in each cycle, according to a scheduling result. For example, configuration data bits of the FUs 113 of group A may include bits of an OP code, bits of intra group connections of interconnections of the FUs 113 of the group A, dedicated register bits of a dedicated register file of the group A, and bits of inter group connections of interconnections of the FUs 113 of other groups. The configuration data bits listed above are exemplary and other types of configuration data bits are considered to be well within the scope of the present disclosure. The last bits of the configuration data bits generated by the scheduling unit 220 may include globally shared bits of a global register file shared by a plurality of groups.

The scheduling unit 220 reorganizes the configuration data so that bits of the global register file are included in the configuration data of the groups in the configuration data bits, to apply a memory mapping method.

A process of determining a memory mapping method and types of memory mapping method will be described below.

Figure 6:
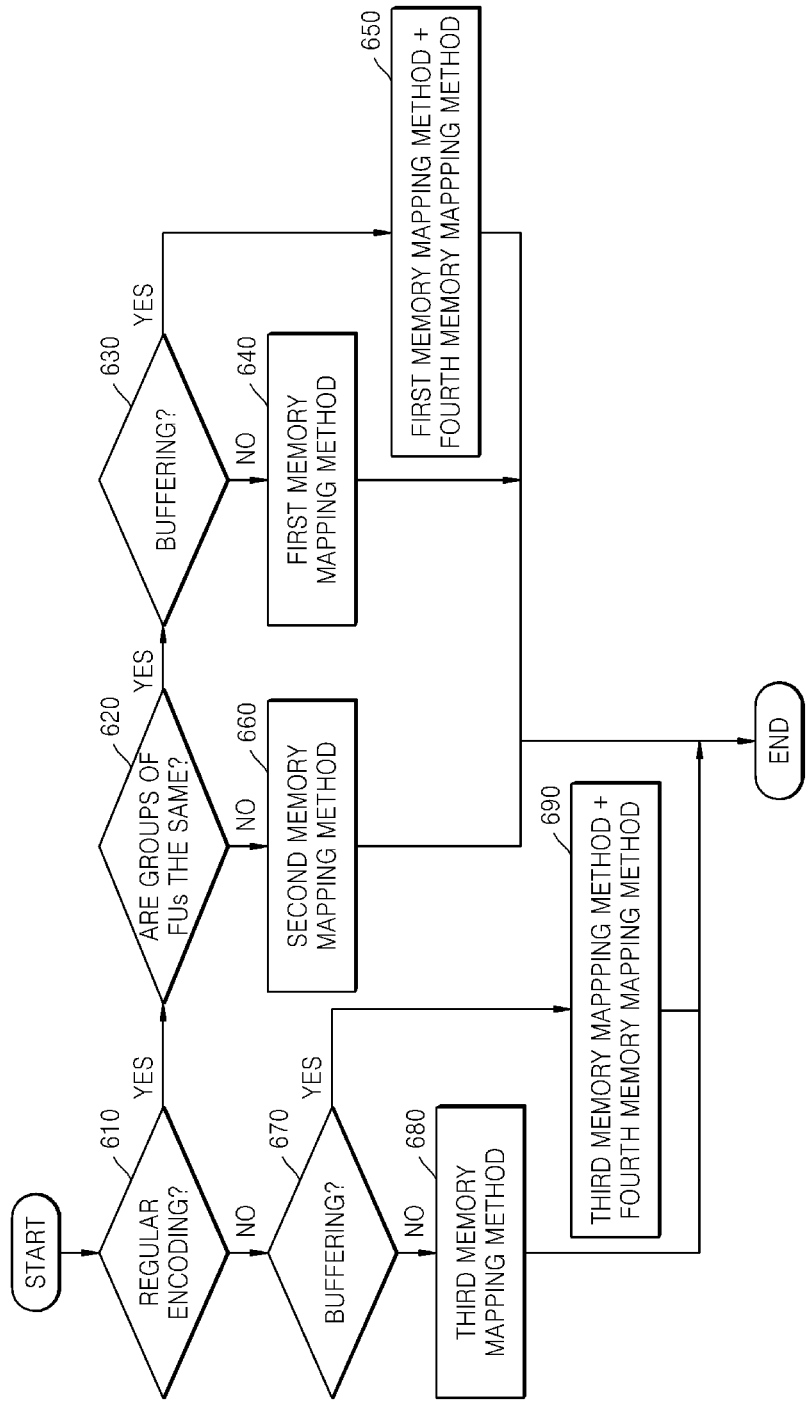
FIG. 6 is a diagram illustrating an example of a process of determining a memory mapping method in a determiner of a compiler.

FIG. 6 is a diagram illustrating a process of determining a memory mapping method in the determiner 230 of the compiler 200. The operations in FIG. 6 may be performed in the sequence and manner as shown, although the order of some operations may be changed or some of the operations omitted without departing from the spirit and scope of the illustrative examples described. Many of the operations shown in FIG. 6 may be performed in parallel or concurrently. The above descriptions of FIGS. 1-5 is also applicable to FIG. 6, and is incorporated herein by reference. Thus, the above description may not be repeated here.

In operation 610, the determiner 230 determines whether regular encoding of configuration data is possible, based on the architecture of the reconfigurable processor 100 and the details of the configuration memory 130.

If it is determined in operation 610 that the regular encoding of the configuration data is possible, in operation 620, the determiner 230 determines whether groups of the FUs scheduled in adjacent cycles of a loop are the same, based on a scheduling result.

In operation 630, the determiner 230 determines whether it is possible to use buffering performed by buffers of the FUs 113, based on the architecture of the reconfigurable processor 100 and the details of the configuration memory 130.

If it is not possible to use the buffering in operation 630, in operation 640, the determiner 230 determines a first memory mapping method. If it is possible to use the buffering, in operation 650, the determiner 230 determines first and fourth memory mapping methods.

If the groups of the scheduled FUs 113 are not the same in operation 620, in operation 660, the determiner 230 determines a second memory mapping method.

If it is determined in operation 610 that the regular encoding is not possible, in operation 670, the determiner 230 determines whether it is possible to use the buffering performed by the buffers of the FUs 113.

If it is determined in operation 670 that it is not possible to use the buffering, in operation 680, the determiner 230 determines a third memory mapping method.

If it is determined in operation 670 that it is possible to use the buffering, in operation 690, the determiner 230 determines third and fourth memory mapping methods.

Figure 7:
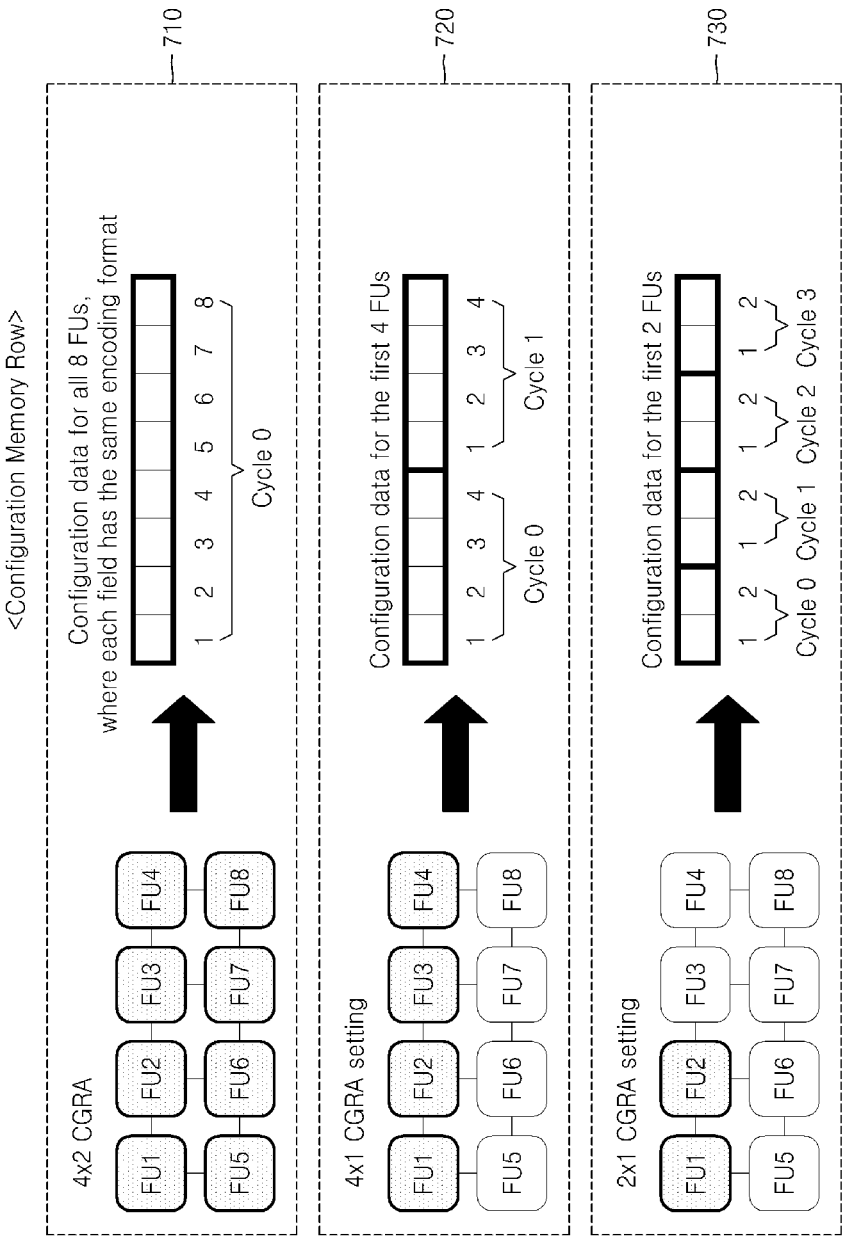
FIG. 7 is a diagram illustrating an example of a first memory mapping method.

FIG. 7 is a diagram illustrating an example of a first memory mapping method. Referring to FIG. 7, the first memory mapping method is a memory mapping method that is determined in operation 640 or 650 of FIG. 6.

If one group of scheduled FUs 113 corresponds to 4×2 CGRA 710, configuration data of cycle 0 of FU 1 through FU8 may be equally mapped on eight fields of the configuration memory 130. The configuration data of the cycle 0 may be mapped on eight fields of the configuration memory 130 through regular encoding in the same encoding format. If eight fields of the configuration memory 130 exist, the memory mapping method of the 4×2 CGRA 710 may map configuration data of one cycle (cycle 0) on one row of the configuration memory 130.

If one group of the scheduled FUs 113 corresponds to 4×1 CGRA 720 or 2×1 CGRA 730, configuration data, which will be processed in at least two or more cycles, may be mapped on one row of the configuration memory 130. According to another example, configuration data, which will be processed in one cycle, may be mapped on one row of the configuration memory 130.

If one group of the scheduled FUs 113 corresponds to the 4×1 CGRA 720, configuration data of cycle 0 of FU 1 through FU 4 may be equally mapped on first four fields of the configuration memory 130. Configuration data of cycle 1 of the FU1 through FU 4 may be equally mapped on the other four fields of the configuration memory 130.

If one group of the scheduled FUs 113 corresponds to the 2×1 CGRA 730, configuration data of cycle 0 of FU 1 and FU 2 may be equally mapped on first two fields of the configuration memory 130, configuration data of cycle 1 may be equally mapped on next two fields of the configuration memory 130, configuration data of cycle 2 may be equally mapped on next two fields of the configuration memory 130, and configuration data of cycle 3 may be equally mapped on last two fields of the configuration memory 130.

Therefore, according to the first memory mapping method, if only some of the FUs 113 are activated in a CGRA mode according to a scheduling result of the scheduling unit 220, configuration data, which will be processed in at least one or more cycles, may be mapped together on one row of the configuration memory 130, thereby optimizing use of the configuration memory 130.

Figure 8:
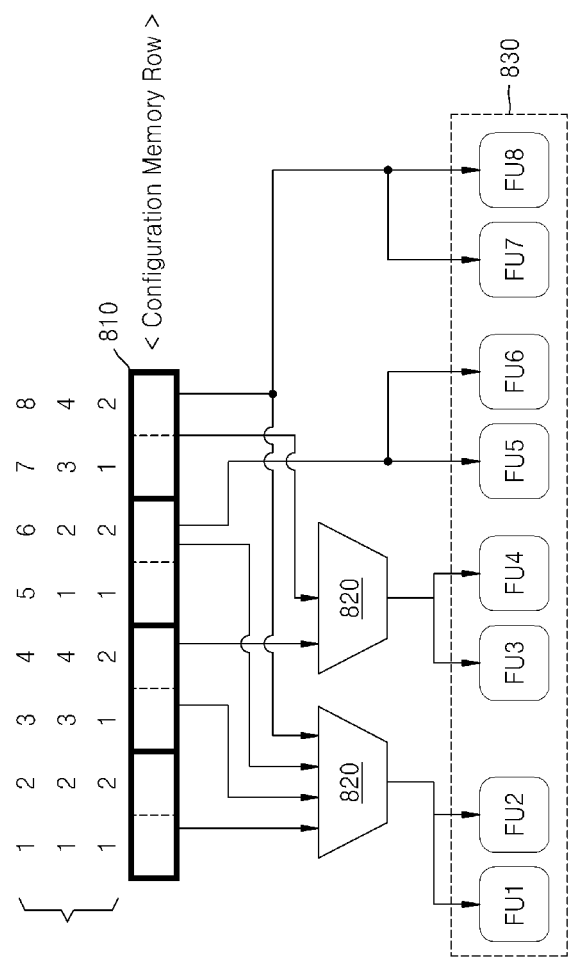
FIG. 8 is a diagram illustrating an example of an architecture of a reconfigurable processor for applying a first memory mapping method.

FIG. 8 is a diagram illustrating an example of an architecture of the reconfigurable processor 100 for a first memory mapping method. The first memory mapping method may be applied to an architecture such as a configuration memory 810, multiplexers 820, and FUs 830. If one group of the FUs 830 is scheduled to be repeatedly activated, the FUs 830 are an architecture that may simultaneously load configuration data from several columns existing in a row of the configuration memory 810. Therefore, the first memory mapping method may be applied to the FUs 830.

Figure 9:
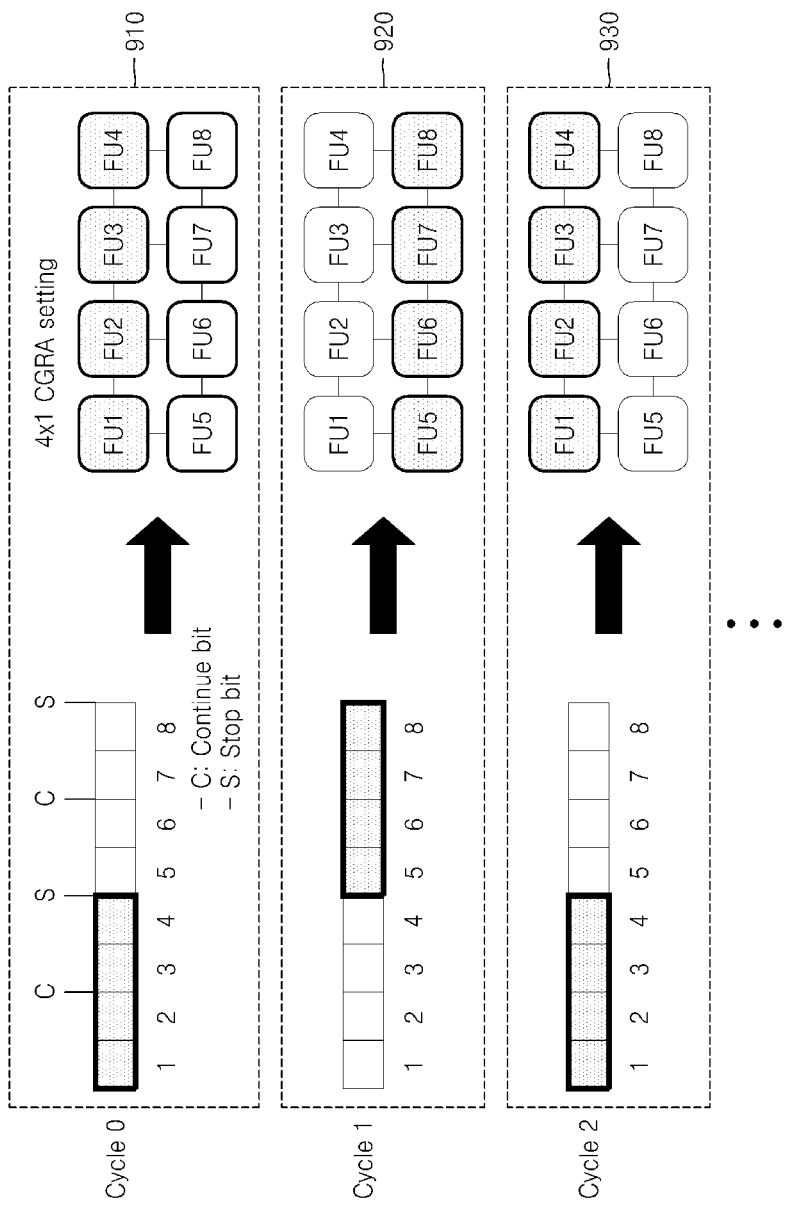
FIG. 9 is a diagram illustrating an example of a second memory mapping method in a 4×1 coarse-grained reconfigurable array (CGRA) mode.

FIG. 9 is a diagram illustrating an example of a second memory mapping method of a 4×1 CGRA mode. Referring to FIG. 9, the second memory mapping method is the memory mapping method determined in operation 660 of FIG. 6. The second memory mapping method may be applied when groups (4×1 CGRA) of different FUs 113 are scheduled to be interleaved and activated.

According to a second memory mapping method, a flag bit for identifying a current cycle is inserted between configuration data of cycles that will be mapped on the configuration memory 810. For example, S of FIG. 9 is a stop bit for identifying that an immediately previous field and an immediately subsequent field are configuration data of different cycles. C of FIG. 9 denotes a continue bit for identifying that an immediately previous field and an immediately subsequent field are configuration data of the same cycle. Thus, if one row of the configuration memory 810 is loaded in the FUs 113, the FUs 113 may identify and process configuration data of each cycle through a flag bit.

In cycle 0 910, the FUs 113 may be scheduled to activate FU 1 through FU 4. In cycle 1 920, the FUs 113 may be scheduled to activate FU 5 through FU 8. In cycle 2 930, the FUs 113 may be scheduled to re-activate FU1 through FU 4.

Configuration data of the cycle 0 910 may be mapped on first four fields in a row of the configuration memory 130. In other words, the scheduling unit 220 may insert a continue bit into a last bit of a second field (or a first bit of a third field) of the configuration memory 130 and insert a stop bit into a last bit of a fourth field (or a first bit of a fifth field) to generate configuration data.

The configuration data of the cycle 1 920 may be mapped on next four fields in a row of the configuration memory 130. In other words, the scheduling unit 220 may insert a continue bit into a last bit of a sixth field (or a first bit of a seventh field) of the configuration memory 130 and insert a stop bit into a last bit of an eighth field to generate configuration data.

Configuration data of the cycle 2 930 may be mapped on the configuration memory 130 in a method similar to that of the cycle 0 910 or the cycle 1 920. If groups of different FUs 113 are scheduled to be interleaved and activated, the determiner 230 may determine a second memory mapping method as described above.

Figure 10:
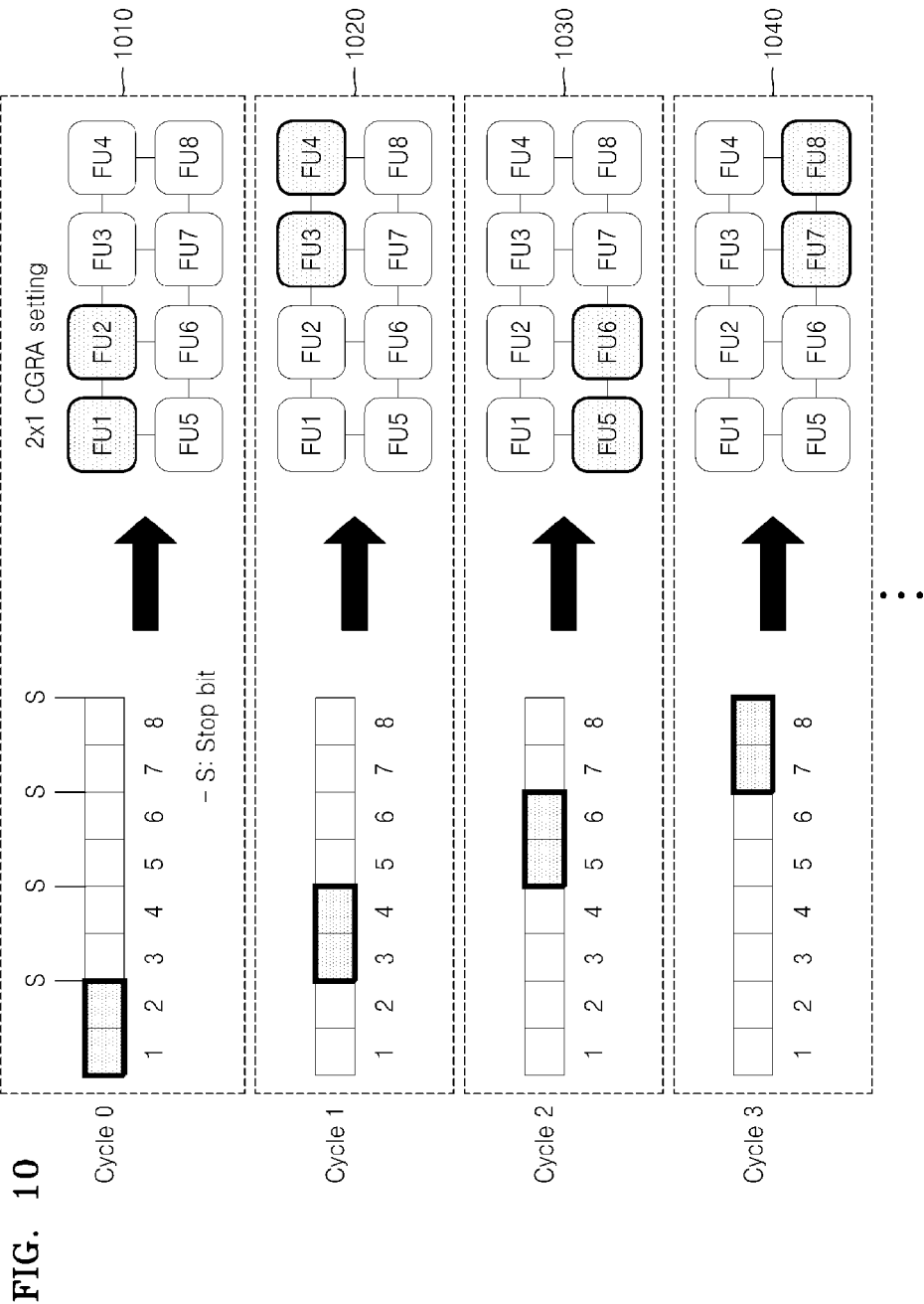
FIG. 10 is a diagram illustrating an example of a second memory mapping method in a 2×1 CGRA mode.

FIG. 10 is a diagram illustrating an example of a second memory mapping method of a 2×1 CGRA mode.

Referring to FIG. 10, the second memory mapping method of the 2×1 CGRA mode is similar to the memory mapping method of the 4×1 CGRA mode of FIG. 9, and thus a detailed description thereof is omitted. The second memory mapping method may be applied when groups (2×1 CGRA) of different FUs 113 are scheduled to be interleaved and activated. In the second memory mapping method of the 2×1 CGRA mode of FIG. 10, cycles 0, 1, 2, and 3 1010, 1020, 1030, and 1040 are divided in the unit of two fields in a row of the configuration memory 130. Therefore, continue bits may not be used, and only stop bits may be used.

Figure 11:
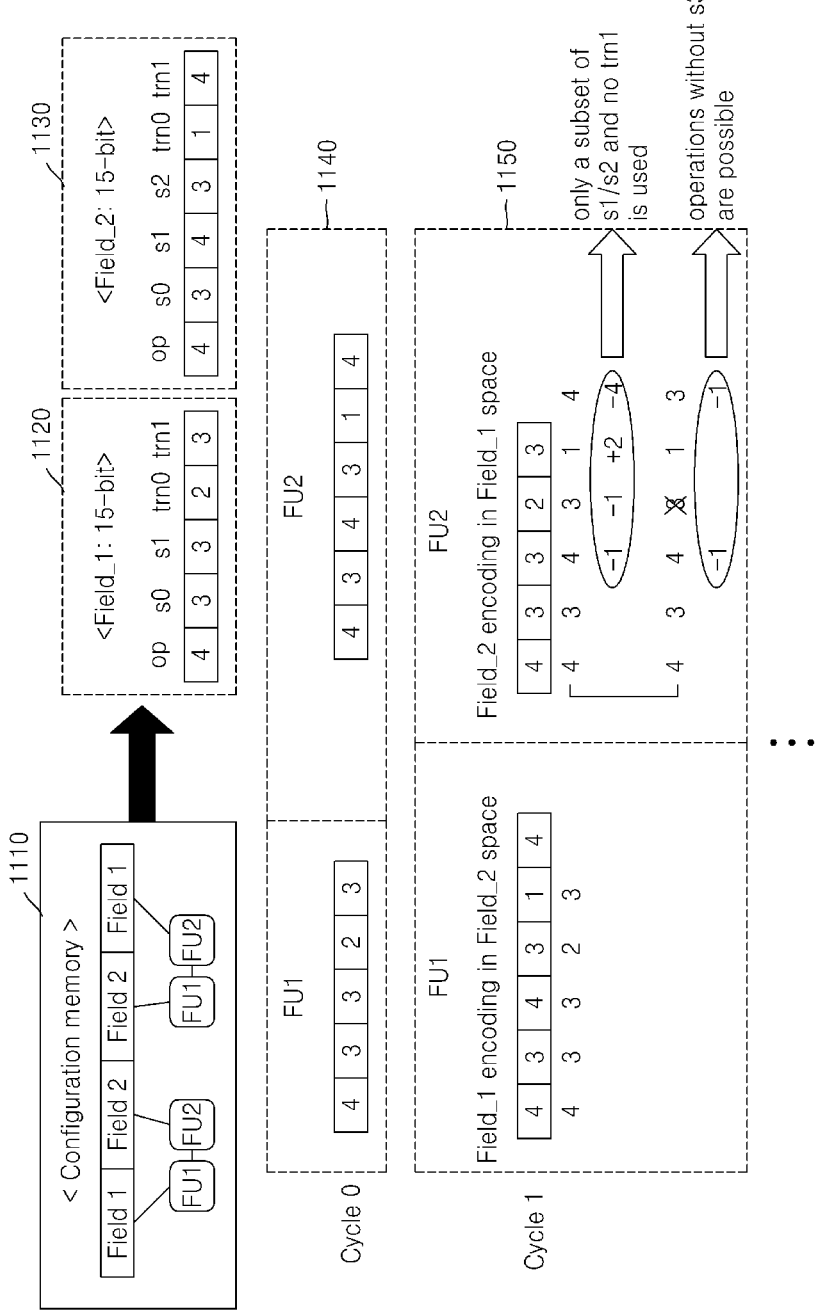
FIG. 11 is a diagram illustrating an example of a third memory mapping method.

FIG. 11 is a diagram illustrating an example of a third memory mapping method.

Referring to FIG. 11, the third memory mapping method is the memory mapping method determined in operation 680 or 690 of FIG. 6. The third memory mapping method may be applied when sizes of fields of a configuration memory 1110 are different from one another. In other words, the third memory mapping method may be applied to regular encoding.

For example, field 1 1120 may have 15 bits, and field 2 may have 19 bits. In field 1 1120, four bits may be allocated to bits op of an OP code, three bits may be allocated to each of bits s0 and s1 of a register file, and two bits and three bits may be allocated to bits trn0 and trn1, respectively of interconnections between the FUs 113.

In the field 2 1130, four bits may be allocated to bits op of an OP code, three bits, four bits, and three bits may be allocated to bits s0, s1, and s2, respectively, of a register file. One bit and four bits may be allocated to bits trn0 and trn1, respectively, of interconnections between the FUs 113.

In cycle 0 1140, FU 1 is mapped on the field 1 1120, and FU 2 is mapped on the field 2 1130. Therefore, configuration data of the cycle 0 1140 of the FU 1 and FU 2 may be mapped on the configuration memory 1110 without losing bits.

In cycle 1 1150, the FU 1 is mapped on the field 2 1130, and the FU 2 is mapped on the field 1 1120.

Since the field 2 1130 has 19 bits, all of the configuration data of 15 bits of the field 1 1120 may be mapped. The field 1 1120 has 15 bits, all of the configuration data of the 19 bits of the field 2 1130 may not be mapped.

Therefore, according to the third memory mapping method, some configuration data of bits s1 and s2 of configuration data of the 19 bits of the field 2 1130 may be mapped on the field 1 1120. Also, configuration data of the cycle 1 1150 may be mapped on the configuration memory 1110 by using irregular encoding by which bit trn 1 is not mapped.

As another example, according to the third memory mapping method, configuration data of the cycle 1 1150 may be mapped on the configuration memory 1110 by using irregular encoding by which bit s2 of the configuration data of the 19 bits of the field 2 1130 is not mapped on the field 1 1120, and only some configuration data of bits s1 and trn1 is mapped.

According to the third memory mapping method, when sizes of fields of the configuration memory 1110 on which configuration data will be mapped are different from one another or sizes of configuration data of cycles are different from one another, configuration data is mapped by using irregular encoding.

Figure 12:
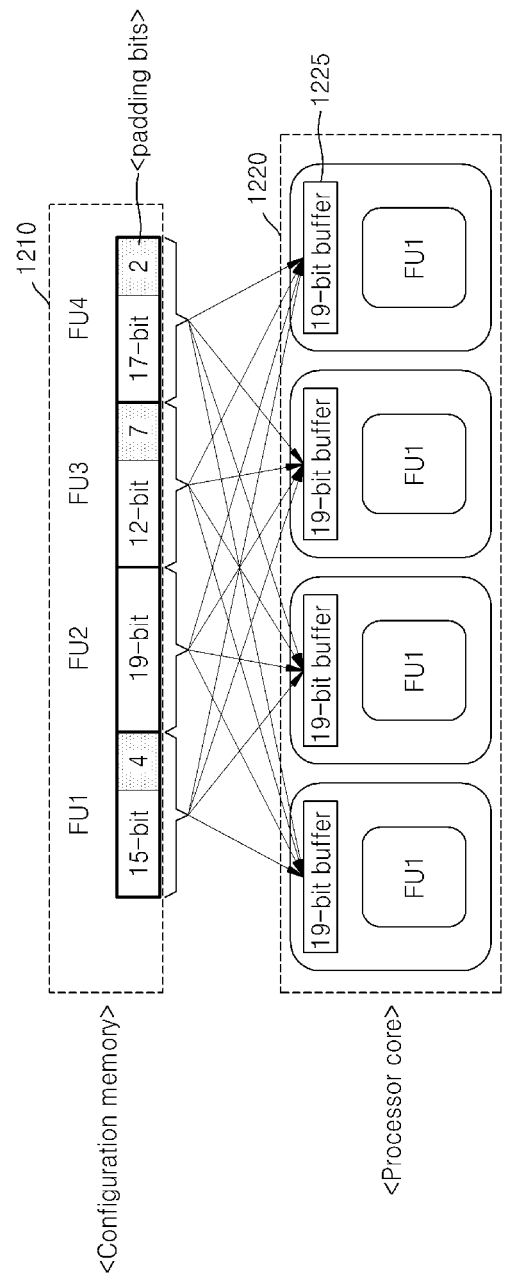
FIG. 12 is a diagram illustrating an example of a fourth memory mapping method.

FIG. 12 is a diagram illustrating an example of a fourth memory mapping method. Referring to FIG. 12, the fourth memory mapping method is the memory mapping method determined in operation 650 or 690 of FIG. 6. The fourth memory mapping method may be applied when it is possible to use buffering performed by buffers 1225 of FUs 113. The fourth memory mapping method may be applied along with other memory mapping methods.

In configuration data mapped on a configuration memory 1210, buffering performed by 19-bit buffers 1225 of FU 1 through FU 4 may be used.

If it is possible to use the buffering, configuration data of 15 bits of the FU 1 may be buffered in the 19-bit buffer 1225 of the FU 1. However, a size of the 19-bit buffer 1225 is larger than a size of configuration data of the FU 1. Therefore, according to the fourth memory mapping method, the configuration data of the FU 1 may be mapped to insert padding bits into the configuration data of the FU 1.

Similarly, if it is possible to use the buffering, according to the fourth memory mapping method, configuration data of FU 3 and configuration data of FU 4 are mapped to respectively insert seven padding bits and two padding bits into the configuration data of the FU 3 and the configuration data of the FU4.

However, since configuration data of FU 2 has the same size as the 19-bit buffer 1225, the configuration data of the FU 4 is mapped without padding bits.

In the examples described above, the first through fourth memory mapping methods have been described. However, the present disclosure may be applied to various types of memory mapping methods, and the determiner 230 may map configuration data on the configuration memory 130 of FIG. 1 by using the first through fourth memory mapping methods and other various types of memory mapping methods.

In other words, according to a method of optimizing use of the configuration memory 130 of the reconfigurable processor 100, various types of memory mapping methods for mapping configuration data, which will be processed in at least one or more cycles, in one row of the configuration memory 130 may be flexibly determined based on an architecture of the reconfigurable processor 100 and details of the configuration memory 130. Therefore, a memory space of the configuration memory 130 may be used efficiently.

As described above, according to the one or more of the examples described above, schedules of optimized FUs may be compiled in a given loop based on an architecture of a reconfigurable processor. Therefore, various types of memory mapping methods of a configuration memory may be flexibly determined, and a memory space of the configuration memory may be used efficiently.

The processes, functions, and methods described above can be written as a computer program, a piece of code, an instruction, or some combination thereof, for independently or collectively instructing or configuring the processing device to operate as desired. Software and data may be embodied permanently or temporarily in any type of machine, component, physical or virtual equipment, computer storage medium or device that is capable of providing instructions or data to or being interpreted by the processing device. The software also may be distributed over network coupled computer systems so that the software is stored and executed in a distributed fashion. In particular, the software and data may be stored by one or more non-transitory computer readable recording mediums. The non-transitory computer readable recording medium may include any data storage device that can store data that can be thereafter read by a computer system or processing device. Examples of the non-transitory computer readable recording medium include read-only memory (ROM), random-access memory (RAM), Compact Disc Read-only Memory (CD-ROMs), magnetic tapes, USBs, floppy disks, hard disks, optical recording media (e.g., CD-ROMs, or DVDs), and PC interfaces (e.g., PCI, PCI-express, WiFi, etc.). In addition, functional programs, codes, and code segments for accomplishing the example disclosed herein can be construed by programmers skilled in the art based on the flow diagrams and block diagrams of the figures and their corresponding descriptions as provided herein.

The apparatuses and units described herein may be implemented using hardware components. The hardware components may include, for example, controllers, sensors, processors, generators, drivers, and other equivalent electronic components. The hardware components may be implemented using one or more general-purpose or special purpose computers, such as, for example, a processor, a controller and an arithmetic logic unit, a digital signal processor, a microcomputer, a field programmable array, a programmable logic unit, a microprocessor or any other device capable of responding to and executing instructions in a defined manner. The hardware components may run an operating system (OS) and one or more software applications that run on the OS. The hardware components also may access, store, manipulate, process, and create data in response to execution of the software. For purpose of simplicity, the description of a processing device is used as singular; however, one skilled in the art will appreciated that a processing device may include multiple processing elements and multiple types of processing elements. For example, a hardware component may include multiple processors or a processor and a controller. In addition, different processing configurations are possible, such a parallel processors.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A method of optimizing use of a configuration memory of a reconfigurable processor, the method comprising:
   analyzing parallelism of a loop of a program code based on an architecture of the reconfigurable processor and details of the configuration memory;
   scheduling groups of function units (FUs), which will be activated in each cycle of the loop, according to the analyzed parallelism to generate configuration data of each cycle; and
   sequentially mapping the generated configuration data in at least one row of the configuration memory with respect to the scheduled groups in adjacent cycles,
   wherein the configuration data of a cycle is mapped uniformly on fields of the configuration memory through regular encoding in the same encoding format; and
   determining whether regular encoding is possible with respect to the configuration data, based on the architecture and the details of the configuration memory; wherein
   based on the determination that the regular encoding is possible, determining whether the scheduled groups of the FUs are the same in the adjacent cycles, and
   based on the determination that the regular encoding is possible and the scheduled groups of the FUs are the same, mapping the generated configuration data in the configuration memory in the adjacent cycles.

2. The method of claim 1, wherein the same types of FUs are scheduled to be activated in each cycle in order to generate the configuration data.

3. The method of claim 1, wherein some of all FUs comprised in the reconfigurable processor are scheduled to be repeatedly activated in each cycle in order to generate the configuration data.

4. The method of claim 1, wherein the configuration data respectively corresponding to the groups are regularly mapped to each of fields of the configuration memory.

5. The method of claim 1, wherein the parallelism is analyzed based on information about the number of FUs comprised in the reconfigurable processor, interconnections between the FUs, and multiplexing between the FUs and the configuration memory.

6. A non-transitory computer-readable recording medium having recorded thereon a program, the program including computer readable instructions, which when executed by at least one processor, causes the at least one processor to execute the method of claim 1.

7. An apparatus for optimizing use of a configuration memory of a reconfigurable processor, the apparatus comprising:
  an analyzer configured to analyze parallelism of a loop of a program code based on an architecture of the reconfigurable processor and details of the configuration memory;
  a scheduling unit configured to schedule groups of function units (FUs), which will be activated in each cycle of the loop, according to the analyzed parallelism to generate configuration data of each cycle; and
  a determiner configured to sequentially map the generated configuration data in at least one row of the configuration memory with respect to the scheduled groups in adjacent cycles,
  wherein the configuration data of a cycle is mapped uniformly on fields of the configuration memory through regular encoding in the same encoding format; and
  the determiner is further configured to determine whether regular encoding is possible with respect to the configuration data, based on the architecture and the details of the configuration memory, wherein
  based on the determination that the regular encoding is possible, the determiner is further configured to determine whether the scheduled groups of the FUs are the same in the adjacent cycles, and
  based on the determination that the regular encoding is possible and the scheduled groups of the FUs are the same, the determiner is further configured to map the generated configuration data in the configuration memory in the adjacent cycles.

8. The apparatus of claim 7, wherein the scheduling unit is configured to schedule the same types of FUs to activate the same types of FUs in each cycle in order to generate the configuration data.

9. The apparatus of claim 7, wherein the scheduling unit is further configured to schedule some of all FUs comprised in the reconfigurable processor to repeatedly activate the some FUs in each cycle in order to generate the configuration data.

10. The apparatus of claim 7, wherein the determiner is configured to classify each of fields of the configuration memory to regularly map the configuration data respectively corresponding to the groups.

11. The apparatus of claim 7, wherein the analyzer is configured to analyze the parallelism based on information about the number of FUs comprised in the reconfigurable processor, interconnections between the FUs, and multiplexing between the FUs and the configuration memory.

12. An apparatus for optimizing use of a configuration memory of a reconfigurable processor, the apparatus comprising:
  one or more processors configured to:
  analyze parallelism of a loop of a program code based on an architecture of the reconfigurable processor and details of the configuration memory;
  schedule groups of function units (FUs), which will be activated in each cycle of the loop, according to the analyzed parallelism to generate configuration data of each cycle; and
  sequentially map the generated configuration data in at least one row of the configuration memory with respect to the scheduled groups in adjacent cycles,
  wherein the configuration data of a cycle is mapped uniformly on fields of the configuration memory through regular encoding in the same encoding format; and
  determine whether regular encoding is possible with respect to the configuration data, based on the architecture and the details of the configuration memory; wherein
  based on the determination that the regular encoding is possible, determining whether the scheduled groups of the FUs are the same in the adjacent cycles, and
  based on the determination that the regular encoding is possible and the scheduled groups of the FUs are the same, mapping the generated configuration data in the configuration memory in the adjacent cycles.

* * * * *